(12) United States Patent
Takahashi et al.

(10) Patent No.: US 7,048,869 B2
(45) Date of Patent: May 23, 2006

(54) PLASMA PROCESSING APPARATUS AND A PLASMA PROCESSING METHOD

(75) Inventors: Kazue Takahashi, Kudamatsu (JP); Toshio Masuda, Toride (JP); Tetsunori Kaji, Tokuyama (JP); Ken'etsu Yokogawa, Tsurugashima (JP)

(73) Assignee: Hitachi, Ltd., Tokyo ( * ) Notice: Subject to any disclaimer, the term of this patent is extended or adjusted under 35 U.S.C. 154(b) by 433 days.

(21) Appl. No.: 09/414,520

(22) Filed: Oct. 8, 1999

(65) Prior Publication Data

US 2002/0040766 A1    Apr. 11, 2002

(30) Foreign Application Priority Data

Oct. 12, 1998    (JP) .................................. 10-289696

(51) Int. Cl.
*B44C 1/22* (2006.01)
*C03C 15/00* (2006.01)
*C03C 25/68* (2006.01)
*C23F 1/00* (2006.01)
*H05H 1/26* (2006.01)

(52) U.S. Cl. ............................ 216/70; 216/67; 216/68; 216/69; 216/71; 427/446; 427/457

(58) Field of Classification Search ............ 216/67–71; 118/723 CB, 723 FI, 723 MR, 719; 156/345; 427/523, 526, 562, 571, 573, 575, 579, 446, 427/457; 438/105, 482, 487, 988, 677, 695, 438/707, 715, 723, 9, 474, 475, 485, 513, 438/709, 710, 729, 788, 792, 798
See application file for complete search history.

(56) References Cited

U.S. PATENT DOCUMENTS 5,254,171 A * 10/1993 Hayakawa et al. .. 118/723 MR
5,324,553 A * 6/1994 Ovshinsky et al. .......... 427/250
5,429,070 A * 7/1995 Campbell et al. ....... 118/723 R
5,589,041 A * 12/1996 Lantsman ............... 204/192.33
5,874,013 A * 2/1999 Tokunaga et al. ............. 216/67
5,961,850 A * 10/1999 Satou et al. ................... 216/67

(Continued)

FOREIGN PATENT DOCUMENTS

JP    07-022393    1/1995

(Continued)

OTHER PUBLICATIONS

Hancock et al, "Time-Resolved Fourier transform infrared emission as a plama diagnostic"J.Vac.Sci.Technol.A 13(6), Nov/Dec. 1995, pp. 2945-2949.*

(Continued)

*Primary Examiner*—Rudy Zervigon
(74) *Attorney, Agent, or Firm*—Antonelli, Terry, Stout and Kraus, LLP.

(57) ABSTRACT

In an oxide film etching process, a plasma having a suitable ratio of $CF_3$, $CF_2$, CF, F is necessary, and there is a problem in that the etching characteristic fluctuates with a temperature fluctuation of the etching chamber. Using a UHF type ECR plasma etching apparatus having a low electron temperature, a suitable dissociation can be obtained, and by maintaining the temperature of a side wall from 10° C. and 120° C., a stable etching characteristic can be obtained. Since oxide film etching using a low electron temperature and a high density plasma can be obtained, an etching result having a superior characteristic can be obtained, and, also, since the side wall temperature adjustment range is low, a simplified apparatus structure and a heat resistant performance countermeasure can be obtained easily.

9 Claims, 3 Drawing Sheets

U.S. PATENT DOCUMENTS

| | | | |
|---|---|---|---|
| 6,015,465 A | * | 1/2000 | Kholodenko et al. ....... 118/719 |
| 6,054,063 A | * | 4/2000 | Ohtake et al. ................ 216/70 |
| 6,215,087 B1 | * | 4/2001 | Akahori et al. ........ 204/298.02 |
| 6,815,365 B1 | * | 11/2004 | Masuda et al. ............. 438/710 |

FOREIGN PATENT DOCUMENTS

| | | |
|---|---|---|
| JP | 08-264515 | 10/1996 |
| JP | 09-326383 | 12/1997 |
| JP | 10-092794 | 4/1998 |

OTHER PUBLICATIONS

Uhm et al, "A theoretical model of bulk plasma generated by the electron-cyclotron-resonance mechanism", Physics of Fluids B: Plasma 5(6), Jun. 1993, pp. 1902-1910 .*

Etrillard et al, "Anisotropic etching of InP with low sidewall and surface induced damage in inductively coupled plasma etching using CF4", J.Vac.Sci.Technol.A 15(3), May/Jun 1997 pp. 626-632.*

Nishino et al, "Smoothing of the Si surface using CF4/O2 down-flow etching", J.Appl.Phys. 74(2)pp. 1349-1353.*

Kuhn et al, "Principles of Physical Chemistry—Understanding molecules, molecular assemblies, supra molecular machines" John Wiley & Sons, Ltd., 1999, pp. 289.*

* cited by examiner

PLASMA PROCESSING APPARATUS AND A PLASMA PROCESSING METHOD

BACKGROUND OF THE INVENTION

The present invention relates to a plasma processing apparatus and a plasma processing method; and, in particular, the invention relates to an apparatus for etching an insulation film, such as a silicon oxide film of a wafer, using a plasma. The invention relates to a plasma etching apparatus and a plasma etching method having a plasma generation source which is capable of effecting a minute processing of an etching pattern, and is further able to maintain a stable etching characteristic during a long period of operation.

One example of a conventional plasma processing apparatuses is an oxide film plasma etching apparatus, and the techniques used thereby and the problems inherent in this apparatus are known. As a conventional plasma source for use in an oxide film plasma etching apparatus, a type which is used most widely is a narrow electrode type high frequency plasma generation apparatus, which is comprised of a pair of opposed electrodes.

Of the known systems of the narrow electrode type of high frequency plasma generation apparatus, there is a system in which a high frequency from 13.56 MHZ to a several 10 MHZ is applied to one electrode and a wafer a high frequency bias of about 1 MHZ is applied separately to the electrode on which a wafer is mounted, and there is another system in which a high frequency is applied to the pair of electrodes.

In this narrow electrode type of plasma source etching apparatus, since the distance between the electrodes is narrow, for example, from 20 mm to 30 mm, it is known as a narrow electrode type plasma source and a parallel flat plate type plasma source. Further, in the narrow electrode type plasma source, it is difficult to generate a plasma in a region where the pressure is low, however, by the addition of a magnetic field, an apparatus is obtained in which a lowering of the discharge pressure can be achieved.

In addition to the above-stated narrow electrode type of apparatus, other plasma etching apparatuses have been known. These apparatuses include a plasma etching apparatus having an induction type plasma source in which an induction coil is used and another plasma etching apparatus in which a plasma etching microwave is introduced. In these apparatuses having an induction type etching source and a microwave type plasma source, it is possible to generate and maintain the plasma under a low pressure; and, since the plasma density is high, such a plasma source is known as a low pressure and a high density plasma source.

In silicon oxide film etching, as an etching gas, a mixture gas, in which argon (Ar), a gas including carbon (C) and fluorine (F), such as $C_4F_8$, and a gas including hydrogen (H), such as $CHF_3$, are mixed, is used; and, further, another mixture gas, in which oxygen ($O_2$) and carbon monoxide (CO) and hydrogen ($H_2$) etc. are added to the above-stated mixture gas, is used. These gases are dissociated by the plasma and are dissolved to form $CF_3$, $CF_2$, CF, and F. The amount and the ratio of this gas molecule species exerts a large influence on the etching characteristic of the silicon oxide film (hereinafter, it will be referred to merely as an "oxide film").

In particular, in the case of a high density plasma source, since the electron temperature in the plasma is high, plasma dissociation progresses, and the plasma comes to have many fluorine gas molecules F. Further, as the ionization progresses, the ratio of neutral gas molecule species (radicals) becomes low. For these reasons, in oxide film etching with a high electron temperature and a high density plasma, since the amount of CFx ($CF_3$, $CF_2$, CF) which adheres to a silicon surface, which is a foundation of the oxide film, is lowered, there are problems in that the etching-speed of the silicon (Si) is large and the selection ratio is small.

As means for solving the above stated problems, a method for increasing the CFx radical amount in the plasma has been known, in which the temperature of the wall face of the etching chamber is raised to about 200° C., in an effort to discharge the deposition film which has adhered to the wall face by reducing the adhesion of the deposition film to the wall face of the etching chamber. As a result, in an apparatus in which a high density plasma is used, to obtain the desired selection ratio, a high temperature performance of the wall face of the etching chamber becomes indispensable.

An oxide film etching apparatus described in Japanese application patent laid-open publication No. Hei 7-183283 is an example of an apparatus in which a wall face of an etching chamber is formed to have a high temperature performance.

As a countermeasure for obtaining the high selection ratio in addition to the above technique, there is a known method in which the electron temperature in the plasma is lowered and plasma dissociation is restrained. More specifically, in this method the plasma application is carried out intermittently, and so this method is called a pulse plasma method.

As another one example of obtaining a high selection ratio, there is a method in which materials for consuming fluorine (F) are installed in an etching 25, chamber in advance. In Japanese application patent laid-open publication No. Hei 9-283494, such a method is described, in which a side wall of an etching chamber is constituted by silicon (Si), and a heating means for heating the side wall and a bias application means are provided, so that the fluorine (F) in the plasma is consumed.

In oxide film etching in which narrow electrode type of plasma generation is used, in correspondence with the fine patterning in which a device pattern size is less than 0.25 μm, it is necessary to make the scattering of the ion incident angle at a portion to be subjected to the etching extremely small. Since the scattering of the ion incident angle causes an abnormality of the etching shape and a decrease in the number of ions reaching the bottom of a deep hole, problems are caused including a lowering of the etching speed and a premature stopping of the etching in the formation of holes. This scattering of the ion incident angle is caused by the incident angle distribution having a spread angle because the ions collide with radicals in the plasma.

To solve the above-stated problems, it is effective to decrease the number of collisions between ions and radicals; more particularly, it is necessary to lower the pressure. As a result, in the narrow electrode type of plasma generation apparatus, because it is difficult to carry out the plasma discharge under low pressure conditions, even under a low pressure sufficient to generate a plasma, it is proposed that the frequency of the plasma generation source be made high and that a magnetic field be applied.

Further, in the narrow electrode type of plasma source in which the distance between the electrodes is narrow, in a case where a low pressure is used, since the average free path distance of the gas molecules becomes long, the collision frequency of the gas molecules is decreased, and, in place of this, the collision between the gas molecules and the electrode becomes dominant.

This is not a preferable condition, since, in the etching apparatus, according to the collision of the gas molecules in the plasma, it is necessary to control the maintenance and the reaction of the plasma; and, as a result, in order to accommodate a lower pressurization, it is necessary to provide a large electrode interval.

When the electrode interval is wide, the surface area of the side wall in the etching chamber becomes large. Here, the surface of the etching chamber is the surface which is subjected to the plasma, and the surface does not include a surface of the top plate (ceiling), a surface of the floor, and a surface of the electrode (the wafer).

Until now, in the narrow electrode type plasma source, from the aspect of the plasma and a wafer, since the side wall area is narrow, the deposition and the gas discharge at the side wall have almost no influence on the etching characteristic; however, in the narrow electrode type plasma apparatus in which a low pressurization is used, it is necessary to take a new countermeasure.

Further, to accommodate a large diameter wafer, it is necessary to make the gas pressure distribution across the wafer face and the reaction product distribution uniform; and, for this purpose, it is necessary to provide a wide electrode interval, and so the area ratio of the side wall becomes more and more important.

The influence of the affects of the reaction products which adhere to the side wall on the etching characteristic is discussed above, however, when the etching is continued over a long period of time, a change of the influence becomes a problem. For example, by repeatedly carrying out etching operation, the temperature of the side wall will rise gradually. When the temperature of the side wall has risen sufficiently, the characteristic of the adhesion and adsorption of the reaction products on the side wall is changed, and, as a result, the etching characteristic fluctuates.

Further, in a case where the amount of the deposition film on the side wall accompanying the etching is increased gradually, in accordance with the dependence on the amount of the deposition film, it is possible to change the desorption and adsorption characteristic of the reaction products at the side wall surface.

A phenomenon in which the etching characteristic is influenced by the time lapse change stated above is known particularly in the case of oxide film etching. As a result, the temperature change of the side wall in the oxide film etching apparatus represents an important problem.

In particular, in a high electron temperature and high density plasma source, it is necessary to establish a high side wall temperature. In the case of a high side wall temperature, even the side wall temperature fluctuates a little, and so the adsorption and desorption characteristic of the deposition film is changed largely. For these reasons, it is necessary to restrain the side wall temperature fluctuation to a small range, and a high accuracy temperature adjustment, such as 200° C.±2° C. needs to be carried out.

As stated above, in any of the plasma sources, to satisfy the requirement for oxide film etching, namely for obtaining a high etching speed, while attaining a high selection ratio, low micro loading, and the passing-through of a deep hole, there still remain problems to be solved.

The important problem in an oxide film etching apparatus involves the dissociation of the gas molecules as the plasma is being formed under the most suitable conditions for the etching of the oxide film. To address this problem, a new plasma generation source producing a high density plasma under a low electron temperature has been proposed. For example, Japanese application patent laid-open publication No. Hei 8-300039, disclosed a UHF type ECR apparatus having a plasma excitation frequency in the UHF band from 300 MHZ to 1 GHz. The electron temperature of the plasma which is excited in the frequency band in the above stated range is low, for example, from 0.25 eV to 1 eV, and the plasma dissociation of $C_4F_8$ is at a level suitable to oxide film etching. Further, since it is an ECR (Electron Cyclotron Resonance) system, even under a low pressure, it is possible to generate a high density plasma.

As stated above, for achieving fine patterning on a wafer of large diameter, it is necessary to make the electron temperature low and to prevent an excessive dissociation of the etching gas, and further to make the plasma density high. Further, it is necessary to make the plasma density, the gas pressure and the reaction product distribution on the wafer uniform; and, as a result, it is necessary to provide an apparatus in which the oxide film etching characteristic is not changed over a long period of operation.

SUMMARY OF THE INVENTION

It is an object of the present invention to provide a plasma processing apparatus and a plasma processing method, wherein, using a UHF type ECR plasma etching apparatus to generate a high density plasma under a low electron temperature necessary for oxide film etching etc., a premature stopping of the etching does not occur, and in which a stable operation or a stable processing can be carried out.

The characteristic feature according to the present invention resides in a plasma processing apparatus and in a plasma processing method using a vacuum processing chamber, a sample table for mounting a sample which is processed in said vacuum processing chamber, and a plasma generation means, wherein, when plasma processing is carried out by generating a plasma by introduction of a gas which contains at least carbon and fluorine into the processing chamber, and by which a gas species is generated which contains carbon and fluorine according to a plasma dissociation, said plasma generation means being a plasma generation means in which the degree of plasma dissociation is in a middle range and said gas species containing carbon and fluorine is generated fully in the plasma, and wherein the temperature of a region which forms a side wall of said vacuum processing chamber is controlled to have a range of 10° C. to 120° C.

In a UHF type ECR plasma etching apparatus having a UHF band microwave radiation antenna disposed at a position opposite to the wafer, an etching gas is supplied from a gas supply portion provided on an antenna portion. The UHF band microwave is radiated directly to the plasma from the antenna and is radiated in the plasma through a dielectric body which is provided at a periphery of the antenna.

In an electrode for mounting the wafer (a wafer mount electrode or a lower electrode), an etching position and a wafer delivery position are located at separate locations, and an electrode raising and lowering function is provided. A distance (called an "electrode interval") between the wafer mount electrode and the antenna or the gas supply plate is established as 50 mm to 100 mm taking into consideration re-association of the reaction products.

According to the plasma processing apparatus, a side wall temperature at a periphery of the electrode is temperature adjusted within a range of 10° C. to 120° C., preferably a range of 30° C. to 50° C. As the side wall temperature fluctuates, a gas species is discharged from a deposition film on the side wall, and this has an influence on the etching characteristic.

In accordance with the present invention, to restrain the above-stated influence, the temperature control accuracy of the side wall is controlled to ±5° C. Since the side wall temperature is low, even when the temperature of the side wall fluctuates by 5° C. degree, the fluctuation of a discharge gas amount which is discharged from the side wall will be small, so that the influence on the etching characteristic can be neglected.

Further, since the plasma source is a UHF type ECR system, the plasma dissociation is in a middle range and a CFx species exists fully to a level necessary for the oxide film etching. Since the problem of a shortage of CFx species and an excess F, which is inherent in a high density plasma source, can be solved, to increase the selection ratio, it is unnecessary to increase the side wall temperature.

Herein, when the dissociation is excessive, F or C becomes rich, and when the dissociation is insufficient, there is a shortage of F, $CF_2$, $CF_3$, etc; accordingly, it is desirable to have a plasma dissociation fall in middle range. Further, since the side wall temperature is controlled to a low temperature, with a side wall temperature control accuracy of ±5° C., the fluctuation of the etching characteristic can be restrained for a long period of operation.

DESCRIPTION OF AN EMBODIMENT OF THE INVENTION

Hereinafter, a plasma processing apparatus and a plasma processing method representing one embodiment according to the present invention will be explained.

Figure 1:
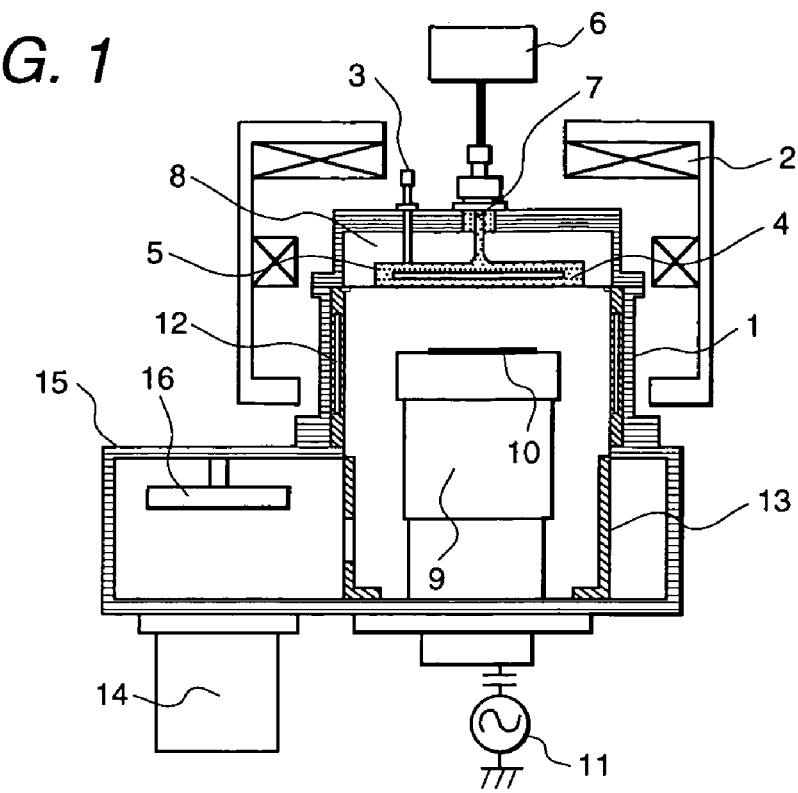
FIG. 1 is a schematic sectional diagram showing an etching apparatus of a plasma processing system representing one embodiment according to the present invention.

FIG. 1 is an example of a UHF type ECR plasma etching apparatus. At a peripheral portion of an etching chamber 1 (a vacuum processing chamber), which is operated as a vacuum vessel, a coil 2 is installed, and this coil 2 generates an electron cyclotron resonance (ECR) field. An etching gas is supplied from a gas supply pipe 3 and is introduced via a gas supply plate 4 to the etching chamber 1. The gas supply plate 4 is comprised of a plate made of silicon or a glass form carbon in which about 100 fine holes having a diameter of from 0.4 mm to 0.5 mm degree are provided.

At an upper portion of the gas supply plate 4, a disc-shaped antenna 5 is provided, and this antenna 5 radiates microwave energy in the UHF band. The microwave energy is supplied to the antenna 5 from a power supply 6 through an induction shaft 7. When the microwave energy is radiated from a periphery of the antenna 5, an oscillating electric field in a space above the antenna 5 is introduced into the etching chamber 1 through a dielectric body 8. Further, between the antenna 5 and an electrode 9, a volume combination electric field is generated, and this electric field becomes an effective plasma generation source. The frequency of the microwave energy is set to a range of from 300 MHZ to 1 GHz and has a band area in which the electron temperature of the plasma is a low temperature of from 0.25 eV to 1 eV.

In this embodiment according to the present invention, a frequency band in the vicinity of 450 MHZ can be employed. Further, as the dielectric body 8, a quartz or an alumina material can be employed. Further, a heat resistant polymer having a small dielectric loss, such as a polyimide etc., can be employed as well.

The electrode for mounting a wafer (the wafer mount electrode or sample table) 9 is provided below the gas supply plate 4, and a wafer 10 representing a sample is supported on the sample table through a electrostatic adsorption. To draw the ions in the plasma to the wafer 10, a high frequency bias is applied to the wafer mount electrode 9 from a high frequency power supply 11.

Further, the temperature control of an inner wall of the etching chamber 1, representing the vacuum processing chamber, which is an essential feature according to the present invention, is carried out at a temperature adjustment side wall 12 of the etching chamber 1. To the temperature adjustment side wall 12, although not shown in the figure, a coolant medium which is temperature controlled is introduced, so that the temperature adjustment side wall 12 is maintained at a constant temperature. In this embodiment according to the present invention, the constant temperature in the temperature adjustment side wall 12 is set to 30° C.

The etching gas and reaction products are deposited on the inner wall of the etching chamber 1 and they are also deposited at the periphery and in a downstream area of the wafer mount electrode 9, so that a deposition film is generated which is the origin of the foreign matter in the etching chamber 1. Accordingly, it is necessary to periodically remove the deposition film, however, it is not always easy to remove a strongly adhered deposition film. Herein, in this embodiment according to the present invention, the cleaning of the deposition film is carried out using an exclusive cleaning apparatus.

The time used for establishing a vacuum state by evacuation of the etching chamber 1, which has been opened to the air for cleaning, is important from an aspect of the non-operation time of the apparatus and further from an aspect of an improvement of the productivity of the apparatus. Accordingly, it is desirable to prevent the deposition film from adhering on a portion where a component exchange-over is not carried out easily, and to try to provide the component to which the deposition film has adhered as a component which can be easily replaced by another clean component. In this way, the opening time for cleaning in the etching chamber 1 can be shortened, and a reduction of the cleaning and evacuation time can be achieved.

In this embodiment according to the present invention, to prevent the deposition film from adhering to the downstream region of the etching chamber 1, a deposition film cover 13 is provided in the downstream region of the temperature adjustment side wall 12 of the etching chamber 1. To the cover 13, a vacuum evacuation and wafer delivery opening portion is provided. Since the deposition film can be removed with this cover 13, the adhesion of the deposition film in the downstream region of the temperature adjustment side wall 12 can be reduced.

A vacuum chamber 15 is connected directly to the etching chamber 1, and a turbo molecular pump 14 having an evacuation speed of from 2000 L/s to 3000 L/s is installed in the vacuum chamber 15. Further, although not shown in the figure, to an opening portion of the turbo molecular pump 14, a vacuum evacuation speed adjustment conductance valve 16 is installed, and this evacuation speed adjustment conductance valve 16 is used for separating the turbo molecular pump 14 during the chamber open time, or the evacuation speed adjustment conductance valve 16 is used for not opening the chamber to the air.

Next, an example of oxide film etching using the plasma processing apparatus of this embodiment according to the present invention will be explained.

To the etching chamber 1 which is evacuated to a high vacuum condition, although not shown in the figure, the wafer 10 is carried in from a transfer chamber by a transfer arm, and the wafer 10 is delivered onto the wafer mount electrode 9. The transfer arm is then retracted, and, after a valve arranged between the etching chamber 1 and a transfer chamber has been closed, the wafer mount electrode 9 is raised to a position where the etching is to be carried out. In the case of this embodiment according to the present invention, the distance between the wafer 10 and the gas introduction plate 4 (an electrode interval) is set to from 50 mm to 100 mm.

As the etching gas, a mixture gas comprised of Ar, and $C_4F_8$, and $O_2$ is used, and the respective flow amounts are 500 sccm, 10 sccm and 5 sccm. The pressure of the etching gas is 2 Pa. The output of the UHF microwave power supply 6 is 1 kW, and the output of a bias power supply 11 to the wafer 10 is 600 W.

A current is applied to the coil 2 and a resonance magnetic field having 0.016 T of UHF energy at 450 MHZ is generated between the gas supply plate 4 and the wafer mount electrode 9 (namely the wafer 10). Next, the microwave power supply 6 is operated. Due to the electron cyclotron resonance phenomenon, a strong plasma is generated in the ECR area having a resonance magnetic field strength of 0.016 T.

To improve the uniformity of the etching characteristic, it is necessary to ensure that the incident ion density on the surface of the wafer 10 is uniform, and, when the ECR is positioned as stated above and the shape of the ECR area is formed with a raised portion extending toward the wafer 10, the required uniformity of the ion current density can be attained.

After a spark of the plasma, not shown in the figure, from a direct current power supply which is connected directly in parallel with the high frequency power supply 11, a high voltage is applied to the wafer mount electrode 9, and then the wafer 10 is electrostatically attracted to and held on the wafer mount electrode 9.

At a rear face of the wafer 10, helium (He) gas is introduced, and the temperature adjustment of the wafer 10 is carried out between the wafer mounting face of the wafer mount electrode 9, which is temperature controlled by a coolant medium, and the wafer 10, through the helium (He) gas.

Next, the high frequency power supply 11 is operated, and a high frequency bias is applied to the wafer mount electrode 9. Accordingly, ions are incident vertically from the plasma onto the wafer 10. In oxide film etching, it is necessary to carry out a processing with high energy ions.

In this embodiment, according to the present invention, a high frequency bias voltage Vpp (the voltage between the maximum peak and the minimum peak) has a value of from 1000 V to 2000 V. In response to the impact of high energy ions with the wafer surface, the temperature of the wafer 10 rises. In oxide film etching, since the selection ratio is high at higher temperature values, the etching characteristic has a superior characteristic, and so the wafer temperature is adjusted to a value of several 10° C. However, since it is necessary to carry out the processing with high energy ions, the heat input amount to the wafer 10 is large, and so the coolant medium temperature of the wafer mount electrode 9 is set in the vicinity of –20° C.

At this time, when the bias voltage is applied to the wafer 10, the etching is started, and the etching is finished within a predetermined etching time. Or, though not shown in the figure, by monitoring the plasma luminescence strength change of the reaction products and further judging the finish point of the etching, an etching finish time can be determined, and, after a suitable over etching has been performed, then the etching is finished. The etching is completed at a time when the application of the high frequency bias voltage is stopped. Simultaneously with this, the supply of the etching gas is stopped.

However, it is necessary to provide a process in which the electrostatically held wafer 10 is released from the wafer mount electrode 9, and, for this purpose, an electric adsorption gas, such as Ar etc., is supplied. By stopping the supply of the electrostatic adsorption voltage, and then connecting the electric supply line to an earth ground, while maintaining the discharge of the microwave energy, an electric adsorption time of 10 seconds is allocated. Accordingly, the electric charges on the wafer 10 are adsorbed by the earth ground through the plasma, and, as a result, the wafer 10 can be removed easily.

When the electric adsorption process is ended, the supply of the electric adsorption gas is stopped, and also the supply of the microwave energy is stopped. Further, the current supply to the coil 2 is stopped. Further, the wafer mount electrode 9 is lowered until the surface thereof reaches the wafer delivery position.

After that, for some time, the etching chamber 1 is evacuated until high vacuum is achieved. At a time point when the high vacuum state has been reached, the valve between the etching chamber 1 and the transfer chamber is opened, the transfer arm is inserted therein and then the waver 10 is carried out. In case there is to be a next etching process, a new wafer is carried in and the etching is performed again according to the above-stated procedures.

In the above description, the representative flow of the etching process was explained.

The electron temperature of the UHF band microwave ECR plasma is in a range of from 0.25 eV to 1 eV and the dissociation of $C_4F_8$, which is the etching gas, does not progress much. The dissociation of $C_4F_8$ is a complicated process, in which the gas species which contributes to the etching is first dissociated from $CF_3$ to $CF_2$, then CF is generated, and finally F is generated. As a result, the higher the electron temperature, the more the plasma becomes rich in F.

As stated in the Background of the Invention, to ensure the proper selection ratio in the oxide film etching, in the deposition of a film on the foundation silicon, it is necessary to restrain the etching according to the high incident ion energy. Namely, since high energy ions are incident on the wafer, when there is no deposition film, there is a possibility that the etching will progress according to a physical sputter.

As a result, for the etching to progress, it is necessary to supply high energy ions to the bottom of a hole, however to ensure the required selection ratio, it is necessary to supply radicals which form a deposition film. It is said that the radicals for forming the deposition film are $CF_3$ and $CF_2$.

On the other hand, F radicals form $SiF_4$ etc. and the foundation silicon is caused to be etched. As a result, to perform high selection ratio etching, it is necessary to make $CF_2/F$ ($CF_2$–F ratio) large. In the case of UHF band microwave ECR plasma, since the electron temperature is low, the generation amount of F is small, and a plasma having a plentiful amount of $CF_3$, $CF_2$ and CF is formed.

Accordingly, as shown in the case of a high electron temperature and a high density plasma, to supply $CF_2$ and $CF_3$, which become insufficient due to the excessive progress of the dissociation of the plasma, it is unnecessary to heat the inner wall of the etching chamber 1 to more than 200° C.

As the necessary points for achieving a fine processing correspondence etching, the following points are stated, namely (1) under a low electron temperature, the plasma dissociation is restrained suitably and a plasma having a large $CF_2/CF$ ($CF_2$–CF ratio) is generated; (2) the discrepancy between a 90° angle and the ion incident angle is restrained to a small value and a tapering formation of the etching shape; and (3) even when the etching is repeated many times, the fluctuation of the etching characteristic is small.

In addition to the above, an item relating to the etching characteristics is an important development problem, however, in the present specification, such an item is not mentioned.

The above-stated item (1) for the necessary points for the fine processing correspondence etching is solved by the use of the UHF band microwave plasma etching apparatus according to the present invention.

As to the above-stated item (2) for the necessary points for the fine practicing correspondence etching, a main cause is that the orbit of the ions is displaced with the collision of the ions and a gas molecule in the vapor phase, and so it is effective to lower the pressure to lessen the occurrence of such collisions. Since the UHF band microwave plasma etching apparatus according to the present invention cases electron cyclotron resonance, it is possible to generate the plasma under a low pressure.

As to the above-stated item (3) for the necessary points for the fine processing correspondence etching, it is necessary to prevent fluctuation of the etching characteristic even when the number of etching operations which are repeated is in the order of several hundred; namely, it is necessary to restrain the time lapse change. A main cause of the time lapse change is the time fluctuation of the kinds of gas which are discharged from the deposition film which adheres to the inner wall (the side wall, the ceiling, etc) and the other components of the etching chamber 1. More specifically, the temperature fluctuation of the members to be subjected to the processing, such as the side wall, represents a large cause of the problem.

As a countermeasure against the restraint of the time lapse change, basically the apparatus is formed so as to prevent fluctuation of the desorption and adsorption phenomenon of the deposition film on the wall face using temperature control; however, in various plasma generation systems, the wall face area used to form the apparatus differs.

Figure 2:
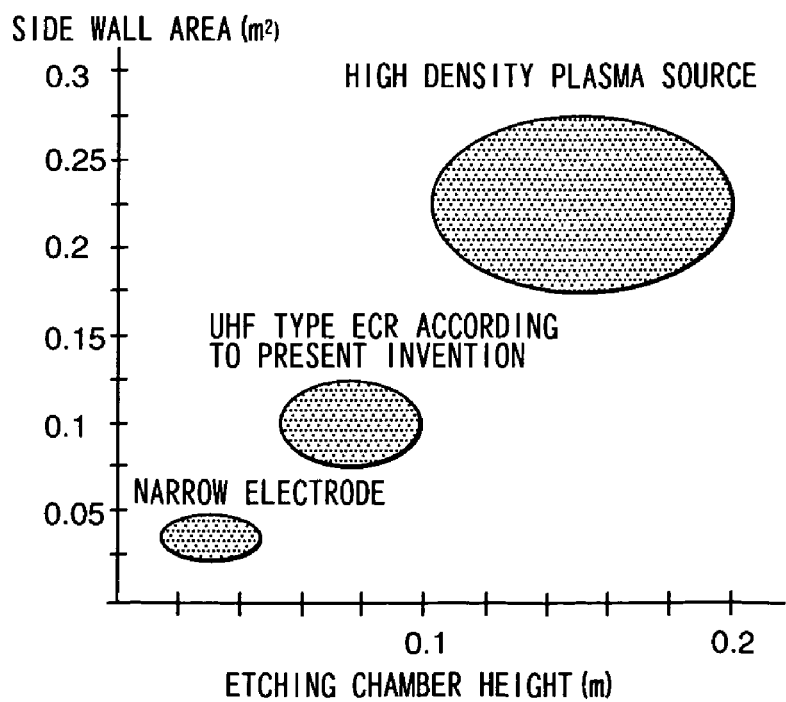
FIG. 2 is a graph showing a size relationship of various kinds of plasma sources of a plasma processing apparatus and a plasma processing method according to the present invention.

The relationship between the etching chamber height and the side face area is shown in FIG. 2. In the narrow electrode plasma type apparatus, the height of the etching chamber is low, and also the area of the side wall face is narrow. On the other hand, in the high density plasma apparatus, the height of the etching chamber is high, and also the area of the side wall face is wide.

In the UHF type ECR apparatus according to the present invention, the height of the etching chamber (the electrode interval) and the area of the side wall are positioned intermediately relative to the other types of apparatus, and the apparatus occupies a region which is suitable for oxide film etching. Namely, according to the present invention, the height of the etching chamber (the electrode interval) and the area of the side wall has a middle value in the 30 mm–100 mm range of the narrow electrode (about 30 mm) and the microwave ECR induction type (more than 100 mm). The height of the etching chamber, namely the electrode interval, is a distance of from 50 mm to 100 mm, and the reaction products generated by the etching are re-dissociated and re-incident on the wafer 10.

For the above stated reasons, the etching characteristic of the oxide film is influenced, however, this is caused by making the most suitable performance to the influence degree, such as the re-dissociation and the incidence of the reaction products etc. with the etching characteristic of the oxide film. Namely, in this embodiment according to the present invention, the electrode interval is set to a predetermined distance which is determined by a relative relationship of the mean free ion path in the vicinity at a pressure of 2 Pa.

Since the electrode interval is set to the above stated distance, the pressure distribution on the face of the wafer 10 can be made uniform. In a case where the wafer diameter is large, such as from 200 mm to 300 mm, the difference in pressure between the center and the periphery of the wafer 10 can be small. Further, since the conductance, which depends on the electrode interval, is large, a high speed of evacuation of the chamber 1 to a high vacuum can be attained, and, as a result, the time during which the etching gas and the reaction products remain in the chamber.

In a case where the area of the side wall is further widened, there is a possibility that the adhesion amount of the deposition film becomes large, with the result that the degree of influence on the etching characteristic becomes large. In an apparatus for maintaining a high density plasma, according to the requirements of the plasma generation method, it is necessary to form the height of the etching chamber to fall in a range from 100 mm to 200 mm. Accordingly, the ratio of the area of the side wall to the whole area of the etching chamber is high, and so the influence on the fluctuation of the etching characteristic by the etching gas and the deposition of the reaction products on the side wall will be large.

As methods for restraining this influence, there are methods in which the temperature fluctuation of the side wall is reduced or the side wall is heated to a high temperature to prevent a deposition film from adhering thereto.

Further, as stated above, in an apparatus using a high density plasma source, since the electron temperature is high, an F-rich plasma is generated. Therefore, to ensure a proper selection ratio, it is necessary to reduce the gas species which adheres to the side wall, or it is necessary to promote a gas discharge from the deposition film. As a result, it is necessary to raise the side wall to a high temperature.

For the above stated reasons, in a high electron temperature and high density plasma etching apparatus, the side wall is heated to 200° C. degree and the temperature fluctuation is maintained within a range of ±2° C. However, it is difficult technically to heat the side wall to a high temperature of more than 200° C., and it is also difficult technically to restrain, with high accuracy, the temperature fluctuation to as little as ±2° C. Further, such a technique invites a complicated structure for the apparatus and a problem in reliability, as well as an increase in cost. Further, the side wall comprises the entire inner wall of the etching chamber, and includes the top plate and other portions which contact the plasma.

In a portion where the deposition film adheres, but which is not contacted directly by the plasma, since this portion has a possibility for affecting the etching characteristic, it is necessary to take such portion fully into consideration. Further, in the apparatus according to the present invention, since the side wall is from 50 mm to 100 mm, the downstream region therefore can hardly comprise a region where the deposition film is adhered. As a result, for oxide film plasma etching, it is desirable to provide an apparatus in which fluctuation of the etching characteristic is not generated, even when the temperature adjustment accuracy in the control of the side wall temperature is mitigated.

In the UHF type ECR plasma apparatus according to the present invention, it is unnecessary to increase the side wall temperature to improve the selection ratio. There is the advantage that the side wall temperature can be established from the view point of the restraint of the time lapse change.

Figure 3:
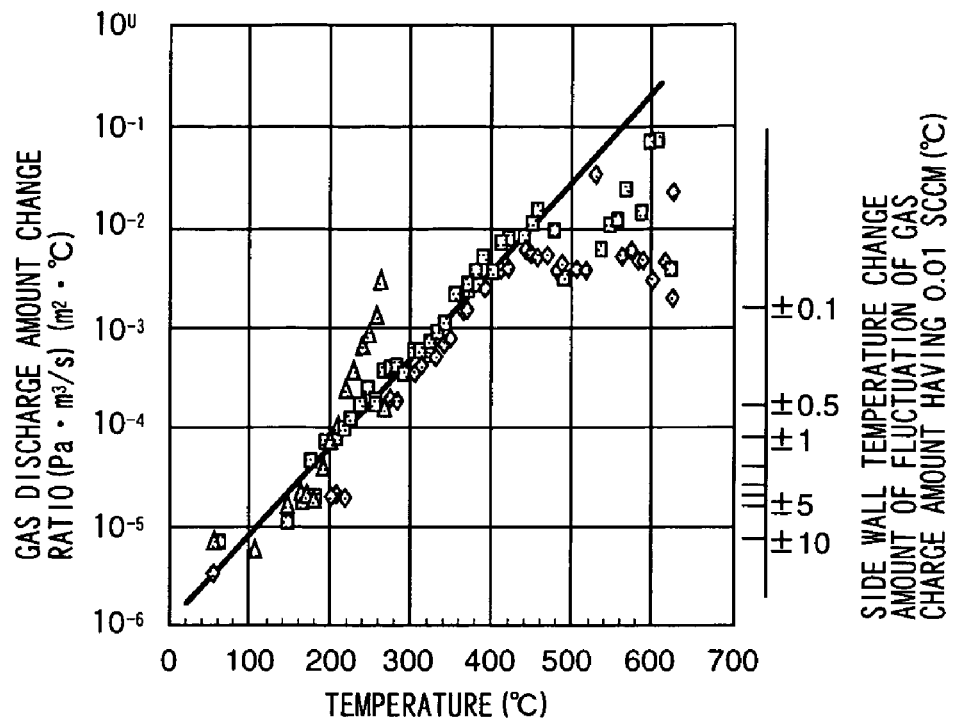
FIG. 3 is a graph showing a characteristic of a gas discharge from a deposition film of a plasma source of a plasma processing apparatus and a plasma processing method according to the present invention.

FIG. 3 shows the results in a case in which the temperature of the deposition film was changed 1° C., and the gas discharge amounts from the deposition film were measured. It is seen from these results that when the temperature of the deposition film is high, a large amount of gas is discharged with a temperature fluctuation of 1° C. it is supposed that when the gas which corresponds to the flow amount of 0.01 sccm by the conversion calculation of the flow amount of the etching gas, there is a possibility that the etching characteristic is influenced, and the temperature adjustment range of the side wall temperature at this time is shown on the right side in FIG. 3.

In the case of a wall temperature of 200° C., when the side wall is not controlled to ±2° C., the fluctuation of the gas discharge amount becomes less than 0.01 sccm. On the other hand, when the side wall temperature is controlled to less than 120° C., even the side wall temperature changes cause a small change in the gas discharge amount. Namely, it is understood that even when the control accuracy of the side wall temperature ±5° C. and ±10° C., the gas discharge for giving an influence to the etching characteristic does not occur.

In the etching apparatus according to the present invention, the side wall temperature is established within a range of from 10° C. to 120° C. Preferably, it is controlled from the room temperature 20° C. to 50° C. With this temperature range, since the etching chamber is not heated to a high temperature, there is the advantage that the size of the apparatus is small, and the materials used for the vacuum sealing and materials having a different thermal expansion coefficient can be used freely, and the temperature control can be performed easily.

According to the present invention, system is provided in which a coolant medium which is connected to the temperature adjustment means is introduced to the side wall. By the employment of such a system, the temperature control can be carried out to less than ±10° C.

Figure 4:
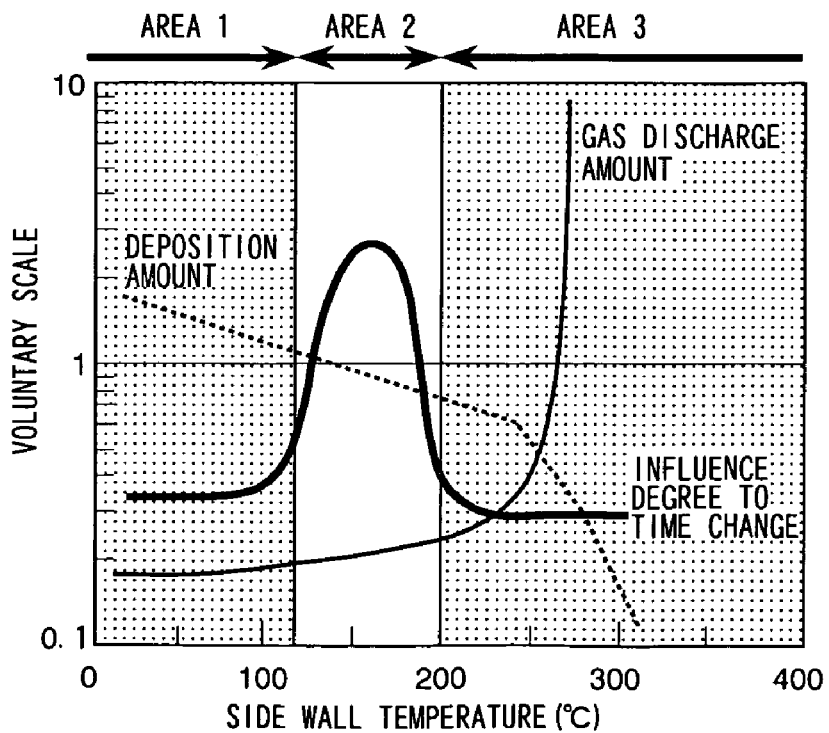
FIG. 4 is a graph showing the influence of a side wall temperature on a time lapse change of a plasma source of a plasma processing apparatus and a plasma processing method according to the present invention.

Further, FIG. 3 shows the results in which the discharge amounts from the deposition film were measured. When the side wall temperature reaches a high temperature of more than 200° C., since the adhesion amounts of the deposition film themselves become small, in an apparatus having a high temperature control in which a deposition film does not adhere, as shown in the example of FIG. 3, substantial gas discharge amounts and the magnitude of the fluctuation amounts into which the consideration of the adhesion amounts is taken are shown in FIG. 4. In FIG. 4, the horizontal axis indicates the side wall temperature of the etching chamber, and the vertical axis indicates the relative magnitude of the deposition film amount, the degree of influence on the time lapse change and the gas discharge amount.

The gas discharge amount from the deposition film increases abruptly for side wall temperatures which exceed 200° C. On the other hand, the amount of the deposition film which adheres to the side wall (the deposition speed) reduces gradually in proportion to an increase in the temperature and decreases abruptly for temperatures in excess of 200° C. The reason for this is that when the temperature exceeds 200° C., and further when the temperature exceeds 300° C., the deposition film does not adhere to the side wall.

Accordingly, in the temperature range of the AREA 1 in FIG. 4, since the side wall temperature is low, the influence for referring to the etching characteristic to the deposition film of the side wall is small. Further, in the AREA 3 in FIG. 4, since the temperature is high, the gas discharge amount from the unit deposition film is large, however a deposition film will hardly adhere, and, as a result, the gas discharge amount is small and the influence on the etching characteristic is small.

However, in the AREA 2 in FIG. 4, which represents an intermediate temperature range between AREA 1 and AREA 3, the deposition film is comparatively large and the gas discharge amount is large, and, as a result, the temperature fluctuation of the side wall has a large influence on the etching characteristic.

Taking into consideration the above-stated points, to restrain the time lapse change, the side wall temperature is set to the AREA 1 or the AREA 3. The temperature range of the AREA 1 is less than 120° C., and in the AREA 3, the temperature range is more than 200° C., while in the AREA 2 the temperature range is from 120° C. to 200° C.

According to this embodiment of the present invention, the temperature of the side wall is established in the temperature range of the AREA 1 in FIG. 4. Further, from the above-described principle, the side wall temperature may be established in the low temperature range, however, taking into consideration the ease in establishing the temperature and providing a coolant medium without creating condensation, the lower limitation temperature is set to 10° C.

Figure 5:
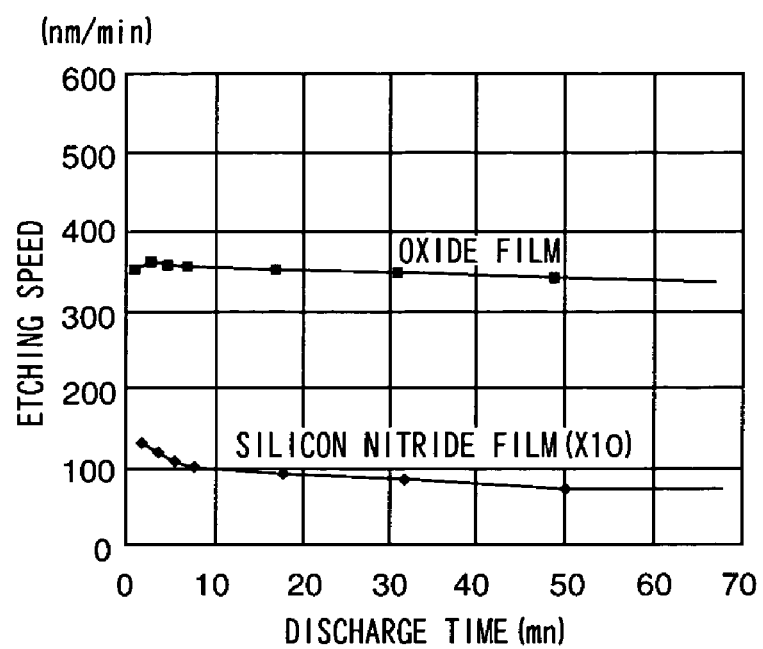
FIG. 5 is a graph showing an etching speed change in a case where a temperature adjustment of a side wall is not performed.

FIG. 5 shows the etching speed fluctuation in a UHF type ECR plasma etching apparatus in a case of using a mixture gas containing Ar and $C_4F_8$, and in which continuous etching is carried out. In this case, the temperature adjustment of the side wall is not carried out, and so the temperature fluctuation rises with the discharge time of the plasma to 60° C. degree from room temperature. The temperature fluctuation is ±20° C. The etching speed of the silicon nitride at the etching starting time is high, as a result of the fluctuation of the etching characteristic.

Figure 6:
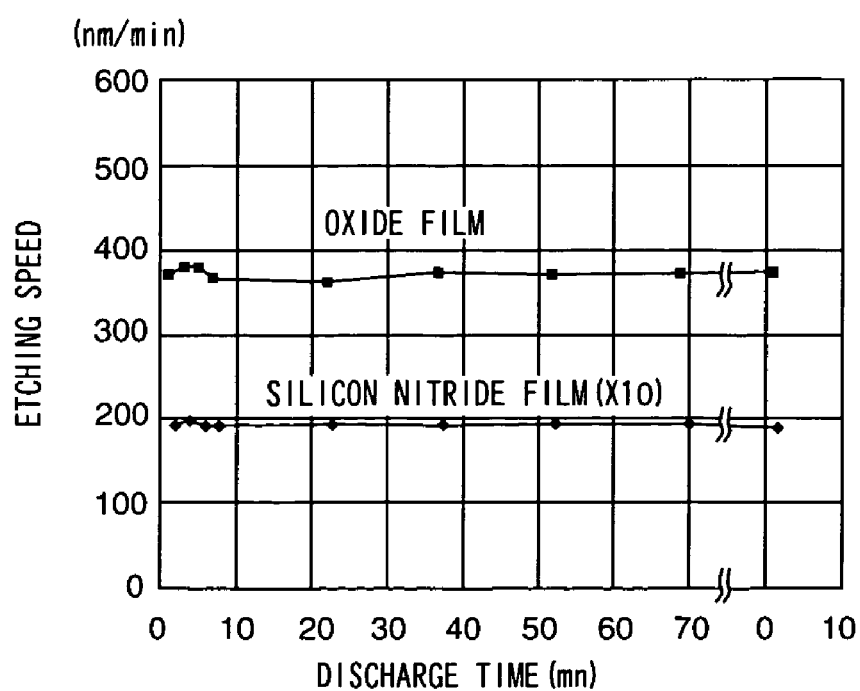
FIG. 6 is a graph showing an etching speed change in a case where a temperature adjustment of a side wall is performed according to the present invention.

On the other hand, FIG. 6 shows the etching characteristic in a case where the temperature adjustment of the side wall is carried out. After the etching chamber is opened to the air and evacuation of the chamber is carried out, but without covering the inner portion of the etching chamber by the deposition film and also the process for presenting the regular state, immediately after the etching is started, the etching characteristic is stable from the starting time of the etching, and the fluctuation after that is not hardly in evidence. Further, the side wall temperature fluctuation at this time is within ±5° C.

As understood from the above-stated results, in a UHF type ECR plasma etching apparatus, by performing a temperature adjustment of the side wall, an extremely stable etching characteristic can be obtained.

Further, in this embodiment according to the present invention, it is assumed that a UHF type ECR plasma etching apparatus is used, however, when the plasma source is suited for the etching of an oxide film, it is not limited to a UHF type ECR plasma etching apparatus. Namely, when the electron temperature in the plasma is the low, for example, an electron temperature of less than 1 eV, and when a high density plasma is used, for example, it is possible to employ an apparatus using a pulse plasma source in which the application of the microwave is carried out intermittedly.

Further, it is possible to employ an apparatus using a plasma source in which an induction type plasma, except for the fact that the microwave is pulse driven. When the side wall of the etching chamber of these plasma sources is established at a range of 10° C. to 120° C., it is possible to obtain a superior oxide film etching characteristic, and, further, it is possible to exhibit a stable characteristic during a long period of operation.

Further, the temperature adjustment of the side wall is exemplified by using a coolant medium, however the invention is not limited to the use of a coolant medium, since it can employ any one of the various types of compulsory cooling using water cooling and vapor cooling, a heater, or lamp heating using infrared rays.

To summarize, the temperature must be formed within the range of 10° C. to 120° C. With the above stated temperature range, even when the temperature adjustment range of the side wall is ±5° C. degree, a fully stable etching characteristic can be obtained.

According to the etching characteristic, even when the temperature adjustment range of the side wall is ±10° C., a stable etching characteristic can be obtained, and the temperature adjustment can be carried out extremely easily.

According to the present invention, since a superior oxide film etching characteristic can be obtained and a stable characteristic can be obtained during a long period of operation, the following advantages can be expected.

Namely, the yield can be improved and the throughput can be improved. Further, since the temperature adjustment is established in a low temperature range of from 10° C. to 120° C., the inconvenience in which the size of the etching chamber is made large due to thermal expansion can be avoided. For example, the line expansion coefficient of the aluminum alloy which is largely used in the etching chamber is $24 \times 10^{-6} K^{-1}$; on the other hand, for alumina and quartz, the respective line expansion coefficients are $6 \times 10^{-6} K^{-1}$ and $0.41 \times 10^{-6} K^{-1}$. Since the line expansion coefficients differ so much, when the etching chamber is heated to produce the plasma discharge or the etching chamber is temperature controlled compulsively at a high temperature, the differences in the sizes between the materials become large, making it necessary to structurally design the chamber to avoid thermal expansion.

Further, the change in size of the vacuum sealing portion exerts an influence on the sealing characteristic, and the heat resistant performance of the elastomer which forms the seal material also becomes a problem. When the temperatures reduces a level of more than 150° C., the possibility that the life of the seal material will be short becomes high.

As stated above, various problems are caused due to high temperature, and the addition of heat resistant performance structurally causes the cost of the apparatus to increase.

What is claimed is:

1. In a plasma processing method using a vacuum processing chamber, a gas supply plate in said vacuum processing chamber, a sample table for mounting a sample which is processed in said vacuum processing chamber wherein the sample is an electrically insulating film, and a plasma generation means, a side wall of said vacuum processing chamber including a temperature adjustment side wall which is positioned in an upper part of said side wall of said vacuum processing chamber, whereby said temperature adjustment side wall surrounds a plasma generating area located between said sample table and said gas supply plate, and a temperature controlling means for controlling a temperature of said temperature adjustment side wall by using a coolant medium, the plasma processing method comprising the steps of:

generating a plasma in said plasma generating area in response to introduction of a gas which contains at least carbon and fluorine for processing said sample, wherein said plasma generation is effected using an electron cyclotron resonance system in which a microwave having a frequency of from 300 MHz to 1 GHz is employed and wherein a degree of plasma dissociation is an intermediate degree and said gas species containing carbon and fluorine is generated fully in the plasma, and concurrently with said plasma generating step, controlling a temperature of said temperature adjustment side wall of said vacuum processing chamber to be in a range of 10° C. to 120° C.

wherein a temperature control accuracy of said temperature adjustment side wall, in said controlling, is ±5° C. for restraining a gas species discharge from said temperature adjustment side wall which contains carbon and fluorine according to a plasma dissociation.

2. A plasma processing method according to claim 1, wherein said plasma generation produces a plasma in which an electron energy is a range of from 0.25 eV to 1 eV.

3. A plasma processing method according to claim 1, wherein in said plasma generation, a drive of a plasma exciting power supply is carried out intermittently.

4. A plasma processing method according to claim 1, wherein said temperature of the region which forms the side wall of said vacuum processing chamber is controlled to have a temperature in a range of 30° to 50° C.

5. A plasma processing method according to claim 1, wherein said plasma processing method is an etching method of the sample.

6. A plasma processing method according to claim 5, wherein said sample has an oxide surface, and during said etching method the oxide surface is etched.

7. A plasma processing method according to claim 5, wherein a distance between said sample table and said gas supply plate in the plasma processing chamber is 50–100 mm.

8. A plasma processing method according to claim 1, wherein a distance between said sample table and said gas supply plate in the plasma processing chamber is 50–100 mm.

9. A plasma processing method according to claim 1, further comprising a deposition film cover which is provided to a downstream region of the temperature adjustment said wall, downstream of the mount of the sample on the sample table, and wherein during said plasma processing a deposition film is formed on said deposition film cover.

* * * * *